United States Patent [19]
De Boer

[11] Patent Number: 5,931,781
[45] Date of Patent: Aug. 3, 1999

[54] MR METHOD FOR THE IMAGING OF JOINTED MOVABLE PARTS

[75] Inventor: Rudolf W. De Boer, Eindhoven, Netherlands

[73] Assignee: U.S. Philips Corporation, New York, N.Y.

[21] Appl. No.: 08/988,513

[22] Filed: Dec. 10, 1997

[30] Foreign Application Priority Data

Dec. 18, 1996 [EP] European Pat. Off. .............. 96203606

[51] Int. Cl.⁶ .................................................. A61B 5/055
[52] U.S. Cl. ........................ 600/415; 600/421; 600/422; 324/318; 324/322
[58] Field of Search ................................... 600/407, 410, 600/415, 421, 422; 324/318, 322; 5/601, 621

[56] References Cited

U.S. PATENT DOCUMENTS

| | | | |
|---|---|---|---|
| 4,834,112 | 5/1989 | Machek et al. ........................ | 128/777 |
| 4,938,230 | 7/1990 | Machek et al. ........................ | 128/777 |
| 5,007,426 | 4/1991 | Le Roux ................................ | 128/653 |
| 5,329,924 | 7/1994 | Bonutti ................................. | 128/653.1 |
| 5,343,580 | 9/1994 | Bonutti ................................. | 5/601 |
| 5,349,956 | 9/1994 | Bonutti ................................. | 128/653.1 |
| 5,427,116 | 6/1995 | Noone ................................... | 128/774 |
| 5,445,152 | 8/1995 | Bell et al. ............................ | 128/653.5 |
| 5,541,515 | 7/1996 | Tsujita ................................. | 324/318 |
| 5,542,423 | 8/1996 | Bonutti ................................. | 128/653.1 |
| 5,577,503 | 11/1996 | Bonutti ................................. | 128/653.2 |
| 5,724,970 | 3/1998 | Votruba et al. ....................... | 128/653.2 |
| 5,758,647 | 6/1998 | Cummins ............................. | 128/653.5 |

FOREIGN PATENT DOCUMENTS

0731362A1 9/1996 Germany .
WO9206386 4/1992 WIPO .
WO9301509 1/1993 WIPO .
WO9616340 5/1996 WIPO .

OTHER PUBLICATIONS

Joachim Brossmann, Claus Muhle, Cornelia Schroder, Uwe H. Melchert, Christian C. Bull, Rolf P. Spielmann, Martin Heller "Patellar Tracking Patterns During Active and Passive Knee Extension: Evaluation with Motion–Triggered Cine MR Imaging", pp. 205–212, Departments of Radiology and Orthopedics, from the 1992 RSNA Scientific Assembly.

*Primary Examiner*—Marvin M. Lateef
*Assistant Examiner*—Eleni Mantis Mercader
*Attorney, Agent, or Firm*—Dwight H. Renfrew, Jr.

[57] ABSTRACT

The invention relates to A method for imaging jointed movable parts of an object by magnetic resonance, where a third part of the object moves along a trajectory near a pivot between a first and a second part of the object, and where the position of the third part is dependent, in conformity with a predetermined relation, on an orientation of the first and the second part relative to the pivot. The method is used, for example for forming a series of images of the patella during the movement of the knee of a human body. According to the method, the measuring zone is adjusted to the instantaneous position of the patella in order to generate imaging pulse sequences. An angle formed by the orientations of the lower leg and the upper leg with respect to one another is measured in order to determine the instantaneous position of the patella. The angle can be determined from the position of RF coils fastened to the lower leg and the upper leg. Another possibility for determining the angle between the lower leg and the upper leg involves the use of MR navigator signals.

17 Claims, 2 Drawing Sheets

MR METHOD FOR THE IMAGING OF JOINTED MOVABLE PARTS

BACKGROUND OF THE INVENTION

1. Field of the Invention

The invention relates to a magnetic resonance method for the imaging of jointed movable parts of an object. The invention also relates to an MR device for forming images of jointed movable parts of an object to be arranged within a steady magnetic field.

2. Description of the Related Art

A method and a device of this kind are known from the document WO 92/06386. The known method is used in medical diagnostics for the imaging of joints and movable parts of a human or animal. According to the known method, a first part of the object is fastened to a first support and a second part is fastened to a second support which is coupled to the first support via a hinge. The first support is cyclically moved. Nuclear spins are excited within a measuring zone in the MR device by an MR pulse sequence which includes an RF pulse and temporary magnetic gradient fields. The position of the measuring zone is determined by the frequency of an excitation RF pulse and the strength of the applied magnetic fields. The position of the measuring zone is adjusted to a point along the trajectory of the first part during the motion. An angular measuring device, coupled to the first support, applies synchronization pulses to the control unit of the MR device in response to the surpassing of angles, predetermined by the position of the measuring zone, between the first and the second part of the object. Since the speed of the first part is known, the first part will be present in the measuring zone for a given period of time after the generation of the synchronization pulse. After reception of the synchronization pulses, the MR system generates an MR pulse sequence and MR signals are generated inter alia in the first part of the object. The generation of MR signals in the first part is repeated until a plurality of MR signals has been received for a reconstruction set for the reconstruction of the image of the first part. This enables imaging of the movable first part in a fixed position within the MR device.

SUMMARY OF THE INVENTION

It is an object of the invention to make the method suitable for the imaging of a third part which is movable along a trajectory near a pivot between the first and the second part of the object, the position of the third part being dependent, in conformity with a predetermined relation, on an orientation of the first and the second part relative to the pivot.

To this end, the method includes the following steps:

a) generating MR signals in the third part in dependence on the orientation of the first and the second part, b) receiving the MR signals generated, c) repeating the steps a) and b) until a plurality of MR signals has been received for the formation of a reconstruction set for the reconstruction of an image, d) processing the reconstruction set so as to form the image of the third part of the object, the following steps being repeatedly executed during the generating of the MR signals:

e) measurement of an angle which is determined by the mutual orientation of the first and the second part of the object and the pivot, f) extraction of an instantaneous position of the third part along the trajectory from the angle measured, and g) adjustment of a measuring zone in such a manner that the instantaneous position of the third part coincides with the measuring zone.

As a result of this step, when the movable third part is in motion, the measuring zone follows the moving third part so that the moving third part always remains within the measuring zone. The invention is based on the recognition of the fact that in a first approximation the position of the third part is dependent on the angle determined by the orientation of the first part and the second part relative to the pivot. Consequently, the method is particularly suitable for the imaging of, for example the knee with the patella and the anterior cruciate ligaments. Furthermore, during the adjustment of the measuring zone translations and rotations can take place with respect to a preceding adjustment of the measuring zone so that the spatial orientation of the third element relative to the measuring zone remains substantially constant during tracking, resulting in reduced motional unsharpness in the image. It is a further advantage that the measuring time is reduced, because MR signals can be continuously generated while the third part follows its trajectory.

A further version of the method according to the invention is characterized in that a fast MR imaging pulse sequence is used for imaging. As a result of this step, the overall measuring time required for determining the plurality of MR signals of the reconstruction set is reduced further. A fast imaging pulse sequence is, for example an Echo Planar Imaging (EPI) pulse sequence, a Fast Field Echo (FFE) pulse sequence, a Turbo Spin Echo (TSE) pulse sequence, or a Gradient And Spin Echo (GRASE) pulse sequence.

The cited pulse sequences are known inter alia from EP-A 604 441.

A further version of the method according to the invention is characterized in that a radial or helical imaging pulse sequence is used for imaging. An advantage thereof consists in that a radial or helical MR method is less susceptible to motions of the object to be imaged.

A further version of the method according to the invention is characterized in that it also includes the following steps:

a. fitting a plurality of RF coils on the first and the second part of the object, b. exciting nuclear spins in the first or the second part, c. measuring an MR signal by means of an RF coil chosen from among the plurality of RF coils while applying at the same time a temporary magnetic field having a gradient in a first direction, d. determining, on the basis of the measured MR signal, a position of the selected RF coil within the steady magnetic field in the direction of the gradient of the applied temporary magnetic field, e. repeating the steps b, c, d for the selected RF coil for other gradient directions, f. repeating the steps b, c, d, e for the other RF coils of the plurality of RF coils, g. determining an angle between the first part and the second part from the positions determined for the RF coils. The advantage of this method resides in the fact that it does not require mechanical constructions for measuring the angle, so that fewer restrictions are imposed as regards the motion of the first and the second part of the object. A method of determining the position of the RF coils is known per se from U.S. Pat. No. 5,318,025. Furthermore, a method combining a radial MR imaging pulse sequence with a method of determining the positions of the RF coils is known from European patent application EP-A 731362.

A further version of the method according to the invention is characterized in that it also includes the following steps:

a. exciting nuclear spins in the first or the second part, b. generating MR navigator signals of nuclear spins within a plurality of reference zones within the first or the second part, c. determining the positions of the plurality of reference zones, d. determining an angle between the first and the second part from the positions determined for the reference zones. The advantage of this method resides in the fact that it is not necessary to arrange additional mechanical or electronic components on the first and the second part so as to determine the angle between the first and the second part. Navigator signals for determining the positions of moving parts are known inter alia from European patent application EP-A-740797 (PHQ 94008).

The invention also relates to an MR device whose control unit is arranged to execute the following steps:

a) generating MR signals in the third part in dependence on the orientation of the first and the second part, b) receiving the MR signals generated, c) repeating the steps a and b until a number of MR signals has been received for the formation of a reconstruction set for the reconstruction of an image, d) processing the reconstruction set so as to form the image of the third part of the object, the MR device including means for measuring an angle between the first part and the second part of the object and the control unit also being arranged to:

derive an instantaneous position along the trajectory of the third part from the angle measured, and to adjust a measuring zone in such a manner that the instantaneous position of the third part coincides with the measuring zone.

A further embodiment of the MR device according to the invention is characterized in that the means for measuring the angle include RF coils for receiving magnetic resonance signals, which coils can be fastened to the first and the second part of the object. This offers the advantage that the angle between the first part and the second part can be simply determined from the coil positions determined.

The above and other, more detailed aspects of the invention will be described in detail hereinafter, by way of example, with reference to the drawing.

BRIEF DESCRIPTION OF THE DRAWINGS

In the drawing:

FIG. 1 shows a magnetic resonance device which includes a first magnet system 2 for generating a steady magnetic field, and also various gradient coils 3 for generating additional magnetic fields having a gradient in the X, Y, Z directions. By convention the Z direction of the co-ordinate system shown corresponds to the direction of the steady magnetic field in the magnet system 2. The measuring co-ordinate system x, y, z to be used may be chosen independently of the X, Y, Z system shown in FIG. 1. The gradient coils 3 are fed by the power supply unit 4. An RF transmitter coil 5 serves to generate RF magnetic fields and is connected to an RF transmitter and modulator 6. A receiving coil is used to receive the magnetic resonance signal generated by the RF field in the object 7 to be examined, for example a patient. This receiving coil may be the same coil as the RF transmitter coil 5. The magnet system 2 encloses an examination space which is large enough to accommodate a part of the patient 7 to be examined. The RF transmitter coil 5 is arranged around or on a part of the patient 7 within the examination space. The RF transmitter coil 5 is connected to a signal amplifier and demodulation unit 10 via a transmission/reception circuit 9. The control unit 11 controls the RF transmitter and modulator 6 and the power supply unit 4 so as to generate special pulse sequences containing RF pulses and gradients. The phase and amplitude supplied by the demodulation unit 10 are applied to a processing unit 12. The processing unit 12 processes the signal values presented so as to form an image by transformation. This image can be visualized, for example by means of a monitor 13.

The method according to the invention for the imaging of jointed movable parts of an object by means of magnetic resonance, where a third part of the object is movable along a trajectory near a pivot between a first and a second part of the object, will be described in detail on the basis of a knee joint of a human body. The method can also be used for other parts of the human body.

Figure 2:
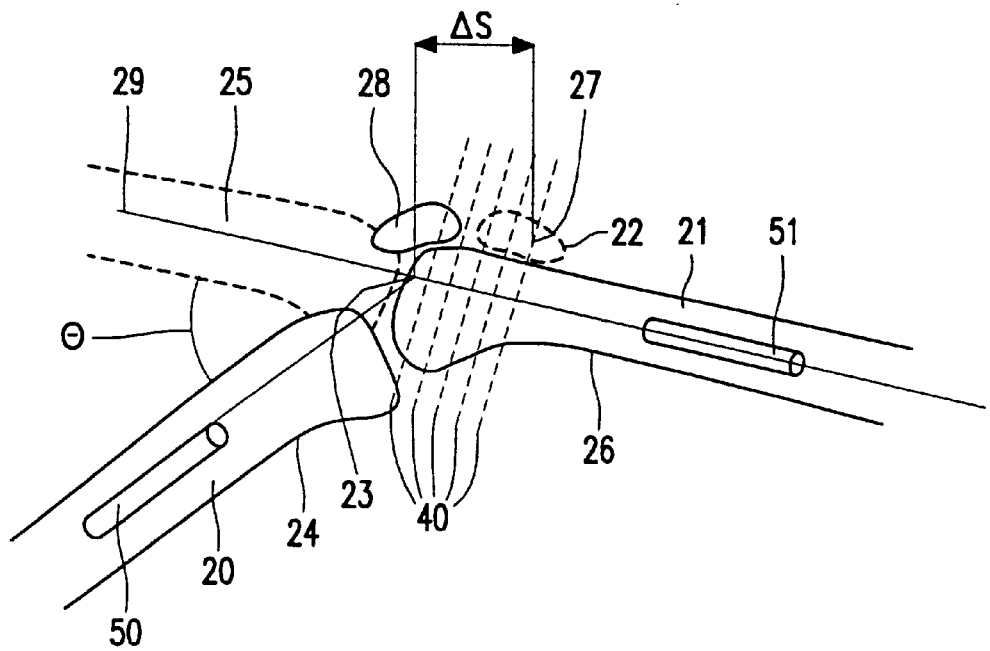
FIG. 2 shows an example of a knee joint.

FIG. 2 shows diagrammatically an example of a knee joint of a human body. FIG. 2 also shows a part 20 of the lower leg as an example of the first part, a part 21 of the upper leg as an example of the second part which is jointed thereto, and the patella 22 as an example of the third part which is movable along a trajectory near a pivot 23 between the lower leg 20 and the upper leg 21, the position of the patella 22 being dependent, in conformity with a predetermined relation, on the mutual orientation of the lower leg and the upper leg. FIG. 2 also shows a first position 24 and a second position 25 wherebetween the lower leg can move. Furthermore, the upper leg is fixed in a third position 26 and the patella 22 can move between a fourth position 27 and a fifth position 28. By way of example, the longitudinal axis 29 of the leg is chosen to extend parallel to the z axis of the MR device. The angle θ is determined by the mutual orientation of the lower leg 20 and the upper leg 21 relative to the pivot 23. An angle measuring device (not shown) is used to measure the angle θ, for example a measuring device of an optical type as known from the cited WO 92/06386. The angle measuring device is fastened to the lower leg 20. An output of the angle measuring device is coupled to the control unit 11.

In order to determine the relation between the angle θ and the position of the patella 22, for example the lower leg 20 is moved from a first position 24 with an angle $\theta_0$, to the second position 25 with an angle $\theta_f$, the respective angles $\theta_0$ and $\theta_f$, the positions $s_0$ and $s_f$ of the patella 22, and the distance $\Delta s$ between the positions $s_0$ and $s_f$ then being determined. If desired, an external drive can be used to move the lower leg. The position of the patella $s_p(t)$ as a function of the angle θ(t) is then given by the formula:

$$s_p(t) = s_0 + \frac{\theta(t) - \theta_0}{\theta_f - \theta_0}(s_f - s_0) \tag{1}$$

Other parameters which describe the change of the orientation of the patella during the movement as a function of the angle θ can also be determined. For example, the patellar tilt angle, the bisect offset and the lateral patella displacement. These parameters are known inter alia from the article "Motion triggered cine MR imaging", by J. Brossmann et al., Radiology, Vol 187, pp. 205–212.

After determination of said parameters, a number of successive images (=cine loop) can be formed by means of the MR device, for example in order to study the motion of the knee of the human body. To this end, the MR device utilizes, for example an Echo Planar Imaging (EPI) method for the acquisition of a number of successive images of the knee.

Figure 3:
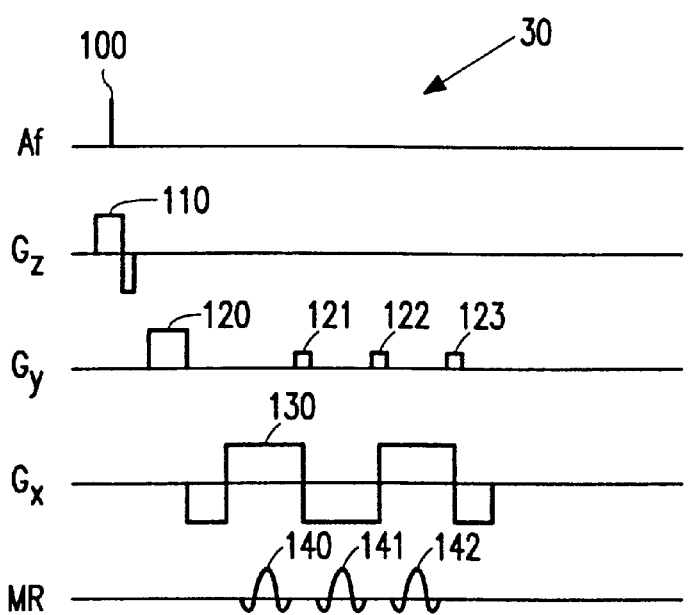
FIG. 3 shows an EPI pulse sequence.

The EPI method is known inter alia from the document EP-A 604441. FIG. 3 shows such an EPI pulse sequence 30 which includes an excitation RF pulse and temporary magnetic gradient fields. The EPI pulse sequence starts with the application of an excitation RF pulse 100, having a flip angle α, and a selection gradient 110 for exciting the spins within a measuring zone, for example a measuring slice in the x, y plane through the patella. The flip angle α amounts to, for example 90°. The selection gradient is a temporary magnetic field which is oriented in the z direction and has a gradient extending in the z direction. After slice selection, an initial phase encoding gradient 120 and a read gradient 130 are applied. The initial phase encoding gradient and the read gradient are both temporary magnetic gradient fields which extend in the z direction and whose gradients extend mutually perpendicularly, both gradients extending in a plane perpendicular to the z axis. Further phase encoding gradients, referred to as "blips" are applied after the second and further zero crossings of the read gradient, so that MR signals can be measured whose sampling instants are situated on lines which are uniformly distributed in the k space. The EPI pulse sequence 30 is repeated for different values of the initial phase encoding gradients $G_y$ in order to measure a complete set of MR signals, said MR signals being associated with, for example 128 or 256 lines in the k space. The number of MR signals that can be generated by means of a single EPI pulse sequence 30 is dependent inter alia on the speed of movement of the patella and is determined experimentally. Instead of the EPI pulse sequence 30, other fast imaging pulse sequences can also be used in the MR device 1, for example a Turbo Field Echo (TFE) pulse sequence, a Turbo Spin Echo (TSE) pulse sequence, and a Gradient And Spin Echo (GRASE) pulse sequence. These pulse sequences are known inter alia from the cited EP-604441.

For the imaging of the knee joint during the movement of the lower leg the control unit 11 according to the invention is also arranged to execute the following steps repeatedly:

deriving an instantaneous position of the patella along the trajectory from the measured angle θ and the already known or predetermined relation between the angle θ and the position of the patella, and adjusting the measuring slice so that the instantaneous position of the patella coincides with the measuring zone, and generating an imaging pulse sequence 30 and receiving the MR signals originating from the patella.

During the execution of these steps the control unit 11 determines the instantaneous position of the patella as a function of the angle θ from formula (1), subsequently derives a frequency content of the excitation RF pulse 100 from the instantaneous position $s_p(t)$ and also a value of the selection gradient 110, and generates an EPI imaging pulse sequence for the measurement of MR signals of the spins in the measuring slice thus adjusted. The exact frequency content of the excitation pulse and the value of the gradients are dependent on the MR device used and can be determined by a person skilled in the art. An image can be reconstructed after the complete set of MR signals has been measured in this manner. The repetition of said steps then yields one or several images of the patella, the measuring slice moving parallel to the z axis so that a lateral displacement of the patella 22 along the z axis is followed. In FIG. 2 such a translation of the measuring slice is represented by a number of parallel planes 40.

The orientation of the patella relative to the measuring slice can be maintained substantially constant also when other parameters are used to describe the changing orientation of the patella, for example the patellar tilt angle and the bisect offset. To this end, the adjustment of the other temporary magnetic fields is made dependent on said parameters, so that the measuring slice is rotated relative to one or several axes of the co-ordinate system x, y, z.

Figure 1:
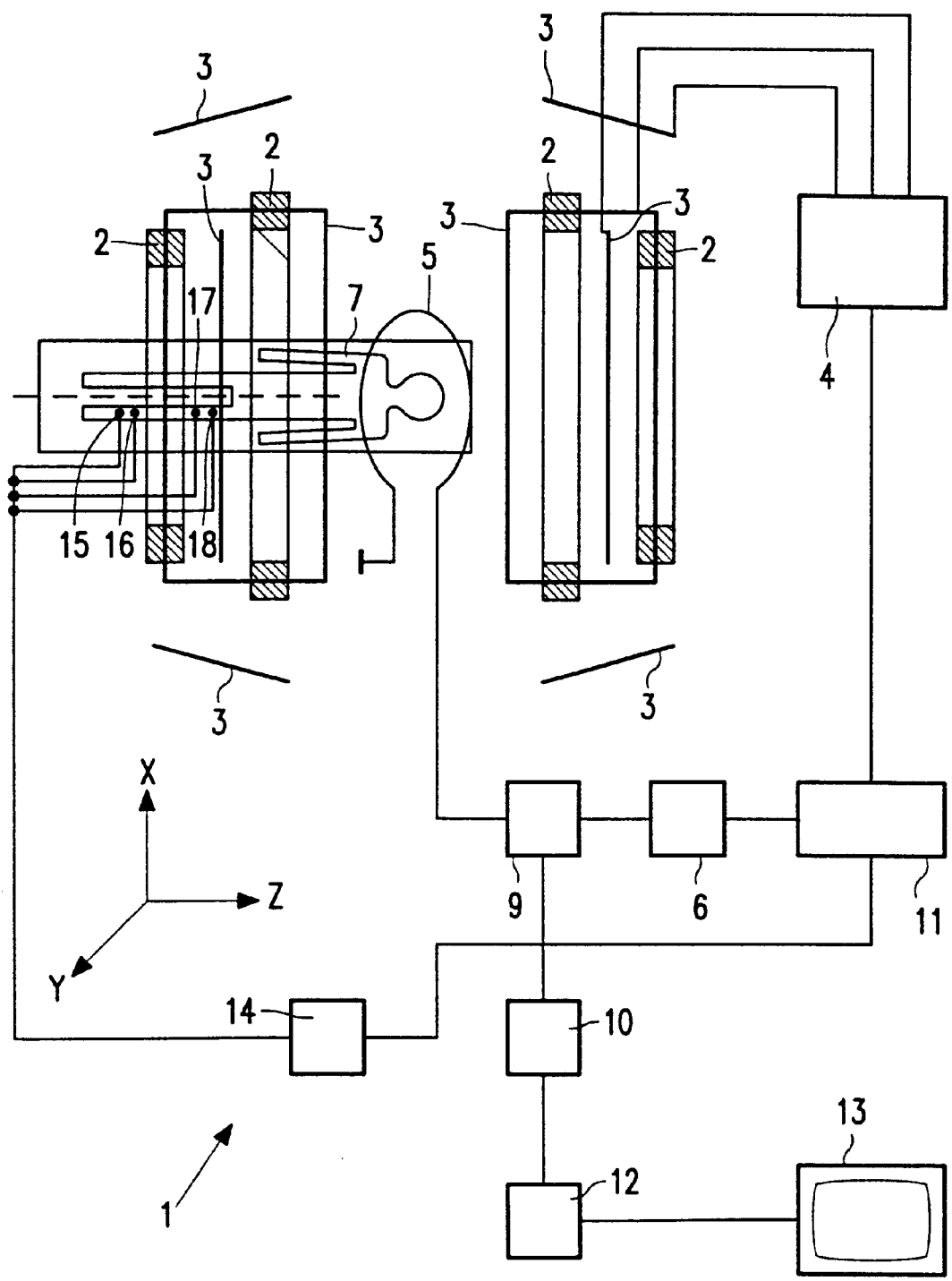
FIG. 1 shows an MR device.

Another possibility for measurement of the angle θ between the lower leg 20 and the upper leg 21 is to use, instead of the angle measuring device, a method for determining the angle θ from the positions of a plurality of, for example four RF coils. FIG. 1 shows, by way of example, the positions of these four coils 15, 16, 17, 18, two RF coils 15, 16 being fastened to the lower leg and two RF coils 17, 18 to the upper leg. Furthermore, the dimensions of the RF coils 15, 16, 17, 18 are preferably limited and smaller than the individual dimensions of the lower leg and the upper leg. The dimensions of such an RF coil may be, for example in the range of from 5 to 10 mm. The RF coils are coupled to the selection and receiving unit 14, a signal output of which is coupled to the control unit 11. Furthermore, the control unit 11 is arranged to execute an MR method for determining the position of the RF coils 15, 16, 17, 18 in the steady magnetic field of the MR device 1. A method of this kind is known from the cited U.S. Pat. No. 5,318,025.

According to this method, the control unit 11 generates position-sensing MR pulse sequences which are inserted between the imaging pulse sequences. A position-sensing pulse sequence includes an excitation RF pulse which excites spins in the upper or lower leg 20, 22. Furthermore, during a next step an MR signal is received from the excited spins by means of an RF coil chosen from among the four RF coils 15, 16, 17, 18, a temporary magnetic gradient field $G_1$, having a gradient in a first direction, being applied at the same time. The selection and receiving unit 14 selects one of the four RF coils and amplifies, demodulates and samples the MR signal received. The data thus obtained is applied to the control unit 11. From this data the control unit determines the position of the selected RF coil in the direction of the gradient of the applied magnetic field $G_1$ by way of a Fourier transformation. The steps of excitation of spins, measurement of the generated MR signal and determination of the position of the selected RF coil are subsequently repeated twice, a magnetic field $G_2$ and a magnetic field $G_3$, having a gradient in a second direction and a third direction, respectively, being applied during the measurement, the gradients of the temporary magnetic fields being mutually orthogonal. Said temporary magnetic fields $G_1$, $G_2$, $G_3$ ensure that the frequency of the MR signal received is linearly dependent on the position of the RF coil along the respective gradients of the temporary magnetic fields. Subsequently, this method is repeated so as to determine the position of the three remaining RF coils 15, 16, 17, 18. The control unit 11 subsequently determines the angle θ from the positions determined for the four RF coils 15, 16, 17, 18. The further steps of the method are identical to the steps described for the method utilizing an angle measuring device. The repetition frequency for said position-sensing pulse sequences relative to the repetition frequency of the imaging pulse sequences is dependent on the speed of movement of the patella and can be determined experimentally.

Another possibility is to integrate the position-sensing pulse sequences with imaging pulse sequences instead of inserting the position-sensing pulse sequences between the imaging pulse sequences. For example, a radial MR method or a helical MR method is used for this purpose.

A radial method is, for example an EPI method in which the temporary gradient fields are applied during the measurement of the MR signal in such a manner that the plurality of lines is uniformly distributed in the k space, the lines passing through the zero point of the k space. The MR image is derived from the measured MR signals by means of projection reconstruction. This method is known from the cited EP-A 731362. The radial method enables, simultaneously with the reception of MR signals for the reconstruction of an MR image, the reception of MR signals by an RF coil selected from among the four RF coils 15, 16, 17, 18 on the upper or lower leg. The position of the MR coils 15, 16, 17, 18 can thus be determined without increasing the number of MR pulse sequences.

In a helical method, for example an EPI method in which the temporary gradient fields are applied during the measurement of the MR signal in such a manner that a plurality of helical lines is uniformly distributed in the k space and that the lines extend through the zero point of the k space. After the reception of the MR signals, an image is reconstructed by way of interpolation and Fourier transformation. A further advantage of the use of a radial or helical method consists in that it is less susceptible to motion artefacts.

In another method according to the invention, positions of reference zones, for example two cylindrical zones 50, 51 in the part of the lower leg 20 and the part of the upper leg 21, respectively, are determined from MR navigator signals generated within the cylindrical zones 50, 51. The length of the cylindrical zones 50, 51 is, for example between 15 and 20 cm and the diameter is, for example 2.5 cm. The angle θ between the part of the lower leg 20 and the part of the upper leg 21 is estimated on the basis of the positions determined. The advantage of this method resides in the fact that it is not necessary to arrange additional mechanical or electronic components on the lower leg and the upper leg. MR navigator signals for the determination of positions of moving parts are known inter alia from the cited patent application EP-A-740797. The navigator signal is generated by means of an additional pulse sequence. Furthermore, the navigator signal contains only a frequency code which is realized, for example by application of the temporary magnetic field with a gradient in a first direction during the measurement of the MR signal. Subsequently, on the basis of the frequency code a position of the reference zone is derived within the steady magnetic field in the direction of the gradient of the applied temporary magnetic field. Analogously, the position can be determined in the directions orthogonal to the first direction. The pulse sequences for generating MR navigator signals can also be inserted between the imaging pulse sequences.

I claim:

1. A magnetic resonance ("MR") method for the imaging of a movable third part of a jointed object, where a third part of the object is movable along a trajectory near a joint between a first part and a second part of the object and where a position of the third part is dependent according to a predetermined relation on an angle determined by the orientation of the first part and the second part relative to the joint the method comprising:

a) generating MR signals from a measuring zone that coincides with an instantaneous position of the third part, the instantaneous position being determined by i) measuring an instantaneous angle determined by the orientation of the first part and the second part of the object relative to the joint, and ii) determining the instantaneous position of the third part along the trajectory near the joint according to the predetermined relation from the instantaneous angle measured, b) receiving the MR signals generated, c) repeating the steps a) and b) until a plurality of MR signals has been received for the reconstruction of an image, d) reconstructing an MR image of the third part of the object from the plurality of received MR signals.

2. A method as claimed in claim 1, wherein a fast MR imaging pulse sequence is used for imaging.

3. A method as claimed in claim 2, wherein the method also includes the following steps:

a. exciting nuclear spins in the first or the second part, b. generating MR navigator signals from nuclear spins within a plurality of reference zones within the first or the second part, c. determining the positions of the plurality of reference zones, d. determining an angle between the first and the second part from the positions determined for the reference zones.

4. A method as claimed in claim 2, wherein a radial or helical MR imaging pulse sequence is also used.

5. A method as claimed in claim 4, wherein the method also includes the following steps:

a. fitting a plurality of RF coils on the first and the second part of the object, b. exciting nuclear spins in the first or the second part, c. measuring an MR signal by means of an RF coil chosen from among the plurality of RF coils while applying at the same time a temporary magnetic field having a gradient in a first direction, d. determining, on the basis of the measured MR signal, a position of the selected RF coil within the steady magnetic field in the direction of the gradient of the applied temporary magnetic field, e. repeating the steps b, c, d for the selected RF coil for other gradient directions, f. repeating the steps b, c, d, e for the other RF coils of the plurality of RF coils, g. determining an angle between the first part and the second part from the positions determined for the RF coils.

6. A method as claimed in claim 5, wherein the method also includes the following steps:

a. exciting nuclear spins in the first or the second part, b. generating MR navigator signals from nuclear spins within a plurality of reference zones within the first or the second part, c. determining the positions of the plurality of reference zones, d. determining an angle between the first and the second part from the positions determined for the reference zones.

7. A method as claimed in claim 2, wherein the method also includes the following steps:

a. fitting a plurality of RF coils on the first and the second part of the object, b. exciting nuclear spins in the first or the second part, c. measuring an MR signal by means of an RF coil chosen from among the plurality of RF coils while applying at the same time a temporary magnetic field having a gradient in a first direction, d. determining, on the basis of the measured MR signal, a position of the selected RF coil within the steady magnetic field in the direction of the gradient of the applied temporary magnetic field, e. repeating the steps b, c, d for the selected RF coil for other gradient directions, f. repeating the steps b, c, d, e for the other RF coils of the plurality of RF coils, g. determining an angle between the first part and the second part from the positions determined for the RF coils.

8. A method as claimed in claim 7, wherein the method also includes the following steps:

a. exciting nuclear spins in the first or the second part, b. generating MR navigator signals from nuclear spins within a plurality of reference zones within the first or the second part, c. determining the positions of the plurality of reference zones, d. determining an angle between the first and the second part from the positions determined for the reference zones.

9. A method as claimed in claim 1, wherein a radial or helical MR imaging pulse sequence is also used.

10. A method as claimed in claim 9, wherein the method also includes the following steps:

a. fitting a plurality of RF coils on the first and the second part of the object, b. exciting nuclear spins in the first or the second part, c. measuring an MR signal by means of an RF coil chosen from among the plurality of RF coils while applying at the same time a temporary magnetic field having a gradient in a first direction, d. determining, on the basis of the measured MR signal, a position of the selected RF coil within the steady magnetic field in the direction of the gradient of the applied temporary magnetic field, e. repeating the steps b, c, d for the selected RF coil for other gradient directions, f. repeating the steps b, c, d, e for the other RF coils of the plurality of RF coils, g. determining an angle between the first part and the second part from the positions determined for the RF coils.

11. A method as claimed in claim 10, wherein in that the method also includes the following steps:

a. exciting nuclear spins in the first or the second part, b. generating MR navigator signals from nuclear spins within a plurality of reference zones within the first or the second part, c. determining the positions of the plurality of reference zones, d. determining an angle between the first and the second part from the positions determined for the reference zones.

12. A method as claimed in claim 9, wherein the method also includes the following steps:

a. exciting nuclear spins in the first or the second part, b. generating MR navigator signals from nuclear spins within a plurality of reference zones within the first or the second part, c. determining the positions of the plurality of reference zones, d. determining an angle between the first and the second part from the positions determined for the reference zones.

13. A method as claimed in claim 1, wherein the method also includes the following steps:

a. fitting a plurality of RF coils on the first and the second part of the object, b. exciting nuclear spins in the first or the second part, c. measuring an MR signal by means of an RF coil chosen from among the plurality of RF coils while applying at the same time a temporary magnetic field having a gradient in a first direction, d. determining, on the basis of the measured MR signal, a position of the selected RF coil within the steady magnetic field in the direction of the gradient of the applied temporary magnetic field, e. repeating the steps b, c, d for the selected RF coil for other gradient directions, f. repeating the steps b, c, d, e for the other RF coils of the plurality of RF coils, g. determining an angle between the first part and the second part from the positions determined for the RF coils.

14. A method as claimed in claim 1, wherein the method also includes the following steps:

a. exciting nuclear spins in the first or the second part, b. generating MR navigator signals from nuclear spins within a plurality of reference zones within the first or the second part, c. determining the positions of the plurality of reference zones, d. determining an angle between the first and the second part from the positions determined for the reference zones.

15. The method of claim 1 wherein the jointed object is a human knee joint, and wherein the moveable third part of the object is the patella of the knee joint.

16. An magnetic resonance ("MR") device for forming an image of a movable third part of a jointed object, where the third part of the object is movable along a trajectory near a joint between a first part and a second part of the object and where a position of the third part is dependent according to a predetermined relation on an angle determined by the orientation of the first part and the second part relative to the joint, the MR device comprising:

means for sustaining a static magnetic field in the object, means for generating temporary magnetic gradient fields in the object, means for generating RF pulses in the object, means for measuring an angle determined by the orientation of the first part and the second part of the object relative to the joint, a control unit for providing control signals to said means for generating RF pulses and to said means for generating temporary magnetic gradient fields in order to generate MR signals from a measuring zone coinciding with an instantaneous position of the third part of the object, wherein the control signals are responsive to the instantaneous position of the third part along the trajectory near the joint, and wherein the instantaneous position is determined according to the predetermined relation from an instantaneous angle measured by said means for measuring an angle, means for receiving the generated MR signals, and a processing unit for processing the received MR signals in order to form an image of the third part of the object.

17. An MR device as claimed in claim 16, wherein the means for measuring the angle include RF coils for receiving magnetic resonance signals, which coils can be fastened to the first and the second part.

* * * * *